XXX

United States Patent
Furuta et al.

(10) Patent No.: US 8,970,319 B2
(45) Date of Patent: Mar. 3, 2015

(54) VARIABLE MATCHING CIRCUIT

(75) Inventors: Takayuki Furuta, Yokohama (JP);
Atsushi Fukuda, Yokosuka (JP);
Hiroshi Okazaki, Zushi (JP); Shoichi Narahashi, Yokohama (JP)

(73) Assignee: NTT DOCOMO, INC., Tokyo (JP)

( * ) Notice: Subject to any disclaimer, the term of this patent is extended or adjusted under 35 U.S.C. 154(b) by 362 days.

(21) Appl. No.: 13/337,683

(22) Filed: Dec. 27, 2011

(65) Prior Publication Data

US 2012/0176205 A1 Jul. 12, 2012

(30) Foreign Application Priority Data

Jan. 7, 2011 (JP) ................. 2011-002222

(51) Int. Cl.
*H03H 7/38* (2006.01)
*H01P 1/203* (2006.01)
*H03H 7/46* (2006.01)

(52) U.S. Cl.
CPC ............. *H03H 7/38* (2013.01); *H01P 1/2039* (2013.01); *H03H 7/46* (2013.01); *H03H 2007/386* (2013.01)
USPC ................................. 333/33; 333/32

(58) Field of Classification Search
USPC ............. 333/32, 33, 34, 35, 1, 4, 5, 238, 246
See application file for complete search history.

(56) References Cited

U.S. PATENT DOCUMENTS

| | | | | |
|---|---|---|---|---|
| 5,808,527 A | * | 9/1998 | De Los Santos | 333/205 |
| 6,043,727 A | * | 3/2000 | Warneke et al. | 333/205 |
| 2006/0202764 A1 | | 9/2006 | Fukuda et al. | |
| 2006/0261911 A1 | | 11/2006 | Fukuda et al. | |
| 2007/0018758 A1 | | 1/2007 | Fukuda et al. | |
| 2008/0100383 A1 | | 5/2008 | Fukuda et al. | |
| 2008/0278260 A1 | | 11/2008 | Fukuda et al. | |
| 2010/0060362 A1 | | 3/2010 | Kanaya et al. | |

FOREIGN PATENT DOCUMENTS

| | | |
|---|---|---|
| CN | 101674053 A | 3/2010 |
| EP | 1 703 634 A1 | 9/2006 |
| EP | 1 916 735 A1 | 4/2008 |
| EP | 1 998 437 A1 | 12/2008 |
| JP | 2008-283430 A | 11/2008 |
| JP | 4464919 | 2/2010 |

OTHER PUBLICATIONS

Extended European Search Report issued on Jul. 18, 2014 in the corresponding European Application No. 12150260.3.
Combined Office Action and Search Report issued Mar. 28, 2014 in Chinese Patent Application No. 201210003945.X with English language translation.

* cited by examiner

*Primary Examiner* — Stephen E Jones
(74) *Attorney, Agent, or Firm* — Oblon, Spivak, McClelland, Maier & Neustadt, L.L.P.

(57) ABSTRACT

A first line stub SB1 and one end of each of two switches SW1 and SW2 are connected to a transmission line 11L at spacings L1, L2 and L3 in order from the input end of the transmission line 11L, the other ends of the two switches are connected to a second line stub SB2, the first and second line stubs have an open end or short-circuit end, and matching at any of four frequency bands can be selected by combining on and off of the two switches SW1 and SW2.

8 Claims, 16 Drawing Sheets

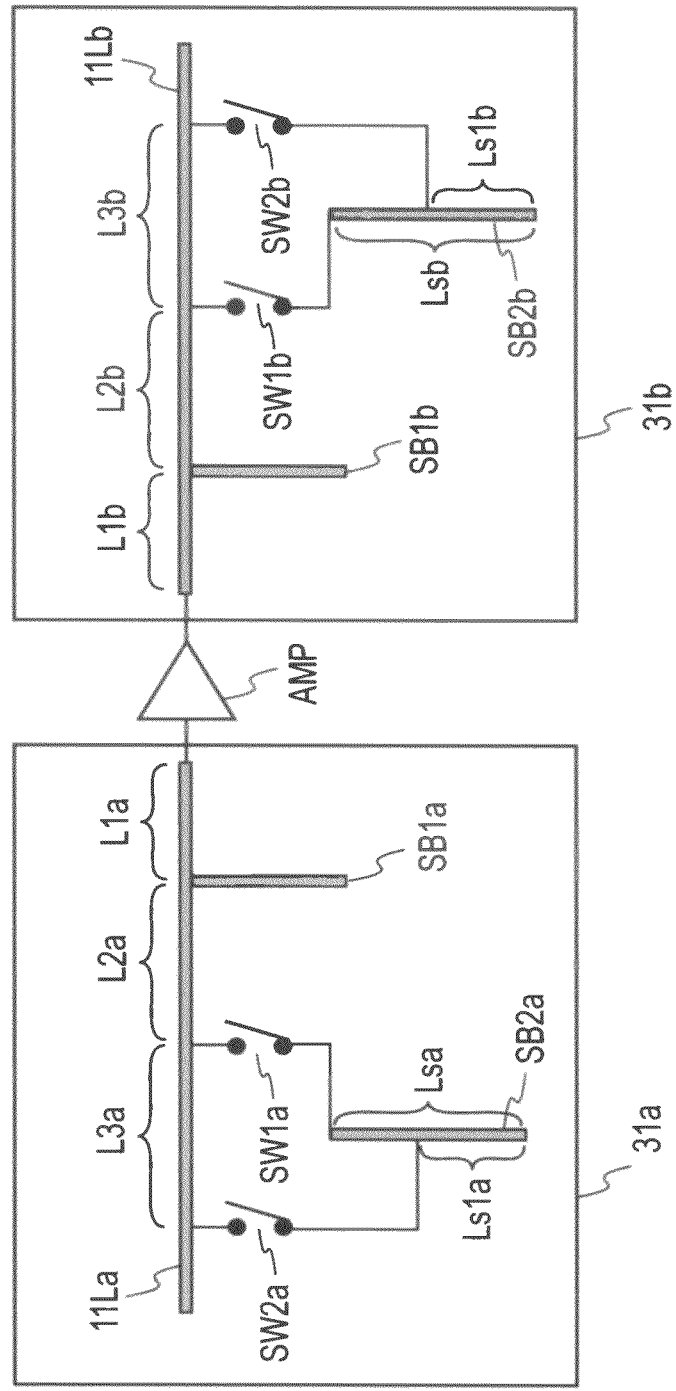

VARIABLE MATCHING CIRCUIT

TECHNICAL FIELD

The present invention relates to a variable matching circuit capable of changing characteristics of the matching circuit in a radio circuit according to a frequency band used.

BACKGROUND ART

It has become the norm that communications are performed with multiple frequency bands in various areas in a mobile communication system. There are plans to further increase available frequency bands. Radio circuits incorporated into mobile terminals in such a system have frequency characteristics and therefore different circuits adjusted to different frequencies are required, causing concern that circuit sizes may become bulky. To avoid bulky circuit sizes, Japanese Patent No. 4464919, for example, describes an approach to supporting multiple bands by providing switches and matching elements in a matching circuit and turning on and off the switches to change impedance in the matching circuit.

For the variable matching circuit described in Japanese Patent No. 4464919 to operate at N bands, a line stub SB1 that functions as a matching element is connected to a line L11 and, in addition, N−1 line stubs SB2 to SBN functioning as matching elements need to be connected to N−1 lines L12 to UN through N−1 switches SW1 to SWN−1 as illustrated in FIG. 19. For example, for the matching circuit to operate at two bands, one switch (SW1) and two matching elements (SB1, SB2) are required; for the matching circuit to operate at three bands, two switches (SW1, SW2) and three matching elements (SB1, SB2, SB3) are required. For example, for using a power amplifier at three bands, two switches and three matching elements are required in each of the matching circuits on the input and output ends of the power amplifier. Basically, one switch and one matching element are used to achieve matching at one desired frequency band. This approach has an advantage that a matching state at different frequencies can be adjusted independently of one another because matching at a frequency band does not affect matching at another frequency band when the switch is off. However, as the number of frequency bands that need to be supported increases, the number of required switches and the number of matching elements increase proportionally, causing to expand the required circuit mounting area.

SUMMARY OF THE INVENTION

An object of the present invention is to provide a variable matching circuit capable of reducing the circuit mounting area by a reduced number of components (switches and matching elements), or capable of supporting more frequency bands with a number of components comparable to the number of the components of the matching circuit in Japanese Patent No. 4464919.

According to a first aspect of the present invention, there is provided a variable matching circuit including a transmission line, first and second switches and first and second matching elements, wherein one ends of the first matching element and the first and second switches are connected to the transmission line at arbitrary distance intervals, the other ends of the first and second switches are connected to the second matching element, the first and second matching elements each have an open end or a short-circuited end, allowing selection of a frequency band by combining on and off of the first and second switches.

According to a second aspect of the present invention, there is provided a variable matching circuit including a transmission line, first to Nth switches (N≥2), and first to Mth matching elements (N≥M≥2), wherein one ends of a first matching element and the first to Nth switches are connected to the transmission line at desired distance intervals, the other ends of all of the first to Nth switches are respectively connected to any ones of the second to Mth matching elements, the other end of each of the first to Mth matching elements is open or short-circuited.

Effects of Invention

With the configuration described above, a variable matching circuit can be configured with fewer circuit elements than a conventional approach (Japanese Patent No. 4464919) to enable a radio circuit to support multiple frequency bands. Accordingly, the area occupied by the radio circuit modularized and the cost of the radio circuit can be reduced.

BRIEF DESCRIPTION OF THE DRAWINGS

FIG. 12 is a diagram illustrating a configuration of a third embodiment;

FIG. 14 is a diagram showing characteristics of the third embodiments when switches SW1a and SW1b are on;

FIG. 15 is a graph showing characteristics of the third embodiments when all of the switches are on:

FIG. 16 is a graph showing characteristics of the third embodiment when switches SW2a and SW2b are on;

DETAILED DESCRIPTION OF THE INVENTION

Embodiments of the present invention will be described below with reference to drawings.

First Embodiment

Figure 1:
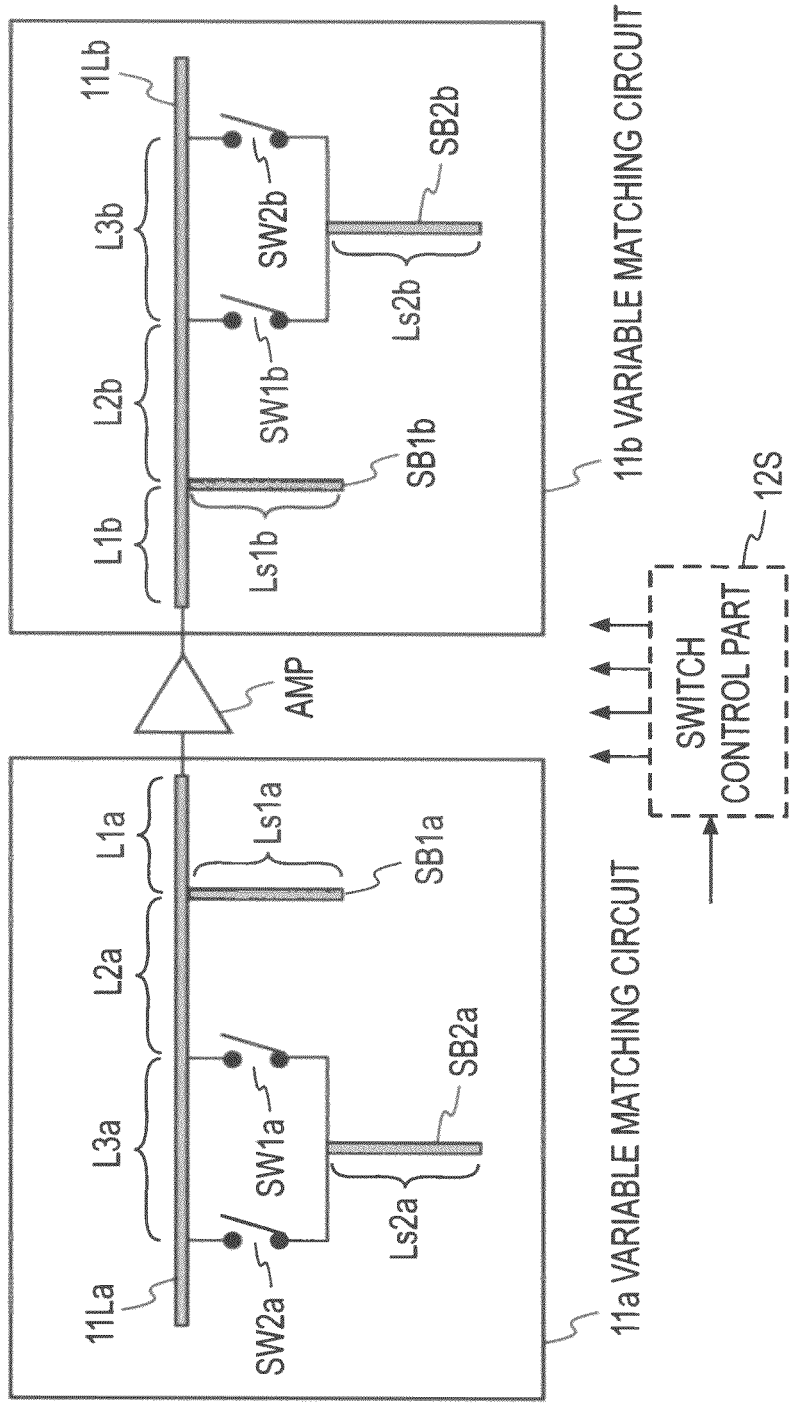
FIG. 1 is a diagram illustrating an exemplary configuration of a variable matching circuit used in a multiband power amplifying apparatus.

FIG. 1 illustrates generally an example of a multiband power amplifying apparatus configured using two variable matching circuits 11a and 11b according to the present invention as matching circuits on the input and output sides of a power amplifier AMP. In the following description, a device that has a mechanically operable configuration is described as a switch (SW). The variable matching circuits 11a and 11b are an example of a radio frequency (RF) circuit device. The multiband power amplifying apparatus 100 is made up of the variable matching circuits 11a and 11b and a single-band power amplifier (hereinafter simply referred to as the power amplifier) AMP. The variable matching circuit 11a on the input side includes a transmission line 11La having a predetermined characteristic impedance, switches SW1a and SW2a each having one end connected to a different position on the transmission line 11La, a line stub SB1a having a length Ls1a, and a line stub SB2a having a length Ls2a one end of which is connected to the other end of each of the switches SW1a and SW2a. The positions on the transmission line 11La where the line stub SB1a and the switches SW1a and SW2a are connected are spaced at distances L1a, L2a and L3a in order from the input end of the power amplifier AMP.

Similarly, the output matching circuit 11b includes a transmission line 11Lb, switches SW1b and SW2b each having one end connected to a different position on the transmission line 11Lb, a line stub SB1b having a length Ls1b, and a line stub SB2b having a length Ls2b one end of which is connected to the other end of each of the switches SW1b and SW2b. The positions on the transmission line 11Lb where the line stub SB1b and the switches SW and SW2b are connected are spaced at distances L1b, L2b and L3b in order from the output end of the power amplifier AMP.

The frequency characteristics of each of the variable matching circuits 11a and 11b can be changed by turning on and off the switches SW1a, SW2a, SW1b and SW2b. Here, the line stubs SB1a and SB2a and the line stubs SB1b and SB2b are used as matching elements. While the matching elements that are directly connected to the transmission lines 11La and 11Lb rather than through a switch, that is, the line stubs SB1a and SB1b, are disposed closest to the power amplifier AMP, they do not necessary need to be disposed to closest to the power amplifier AMP; the line stubs SB1a and SB1b may be connected farthest from the power amplifier AMP among the elements connected to the transmission lines 11La and 11Lb or the elements may be connected in any order.

Figure 2:
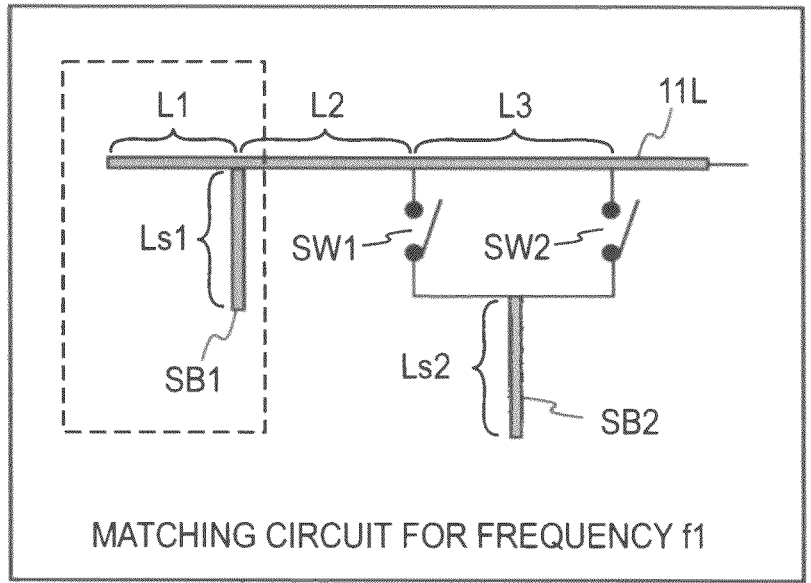
FIG. 2 a diagram illustrating an exemplary functional configuration of the variable mating circuit 12.
Figure 3:
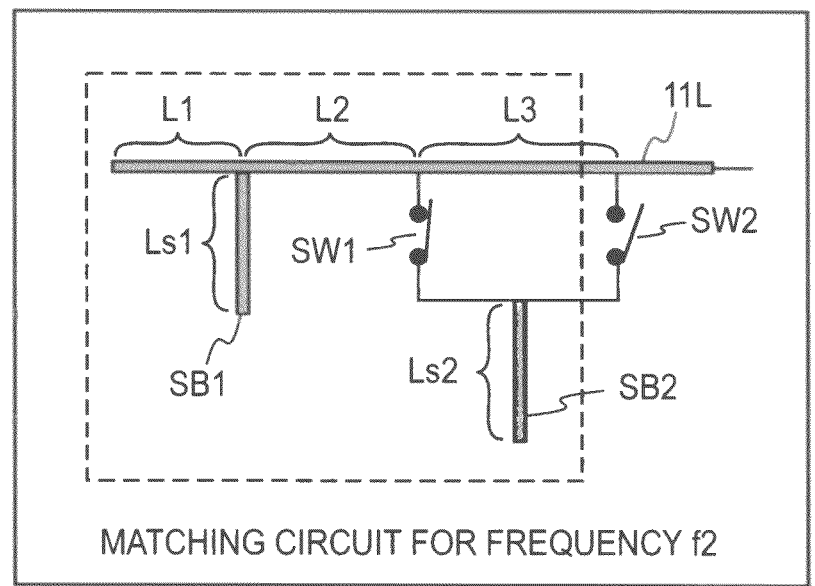
FIG. 3 is a diagram illustrating an exemplary functional configuration of the variable matching circuit 12.
Figure 4:
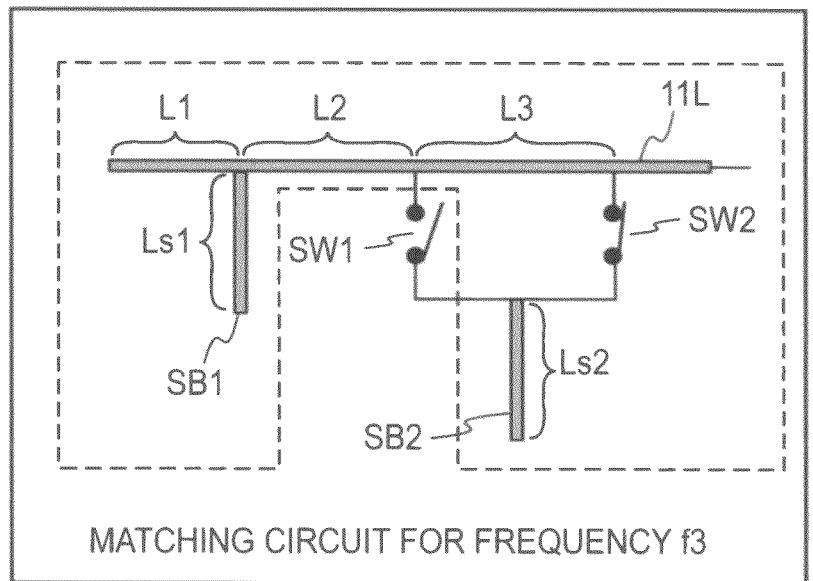
FIG. 4 is a diagram illustrating an exemplary functional configuration of the variable matching circuit 12.
Figure 5:
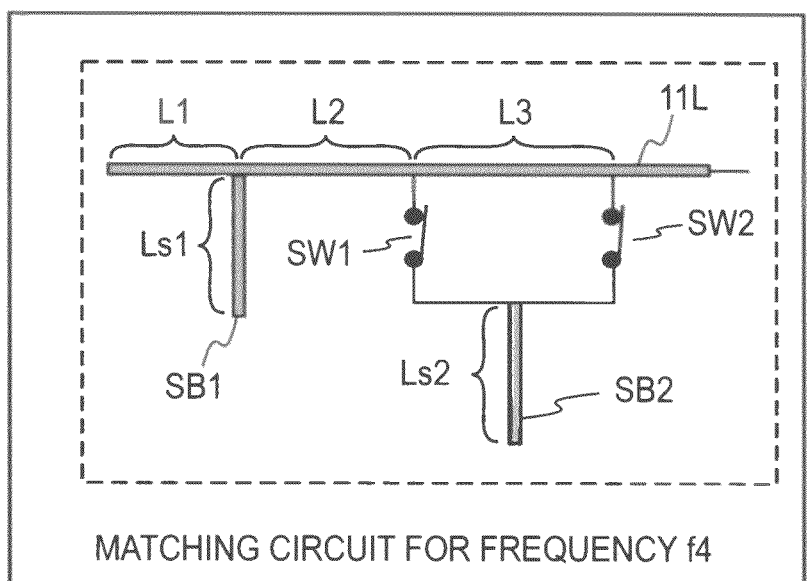
FIG. 5 is a diagram illustrating an exemplary functional configuration of the variable matching circuit 12.

An operation of the variable matching circuits will be described below with reference to FIGS. 2 to 5. The operation will be described by taking the output-side variable matching circuit 11b. In the following description, symbol b which indicates the output side will be omitted from the reference numerals. The length of the transmission line section L1 and the length Ls1 of the line stub SB1 are determined so that when both of the switches SW1 and SW2 in FIG. 2 are off, the transmission line section L1 and the line stub SB1 contribute to matching and perform matching operation at a frequency f1 (the term frequency f1 as used herein means a frequency band with a center frequency f1; the same applies to other frequencies). As illustrated in FIG. 3, the length of the transmission line section L2 and the length Ls2 of the line stub SB2 are determined so that when switch SW1 is on and switch SW2 is off, the transmission line sections L1 and L2 and the line stubs SB1 and SB2 contribute to matching and perform matching operation at a frequency f2. As illustrated in FIG. 4, the length of the transmission line section L3 is determined so that when the switch SW2 is on and switch SW1 is off, the transmission line sections L1, L2 and L3 and the line stubs SB1 and SB2 contribute matching and perform matching operation at a frequency f3. Furthermore, as illustrated in FIG. 5, when both of the switches SW1 and SW2 are on, the line stubs SB1 and SB2 and the transmission line sections L1, L2 and L3 contribute to matching and perform matching operation at a frequency f4.

The forgoing description also applies to impedance matching by the input-side matching circuit 11a of the power amplifier AMP in FIG. 1 with respect to the impedance of the power amplifier AMP as seen from the input side thereof. While the line stub SB2 having an open end is used as the matching element connected to the transmission line 11L through a switch in this example, a line stub having a short-circuited end, a shunted capacitor or inductor may be used instead. Similarly, a line stub having a short-circuited end, a shunted capacitor or inductor may be used instead of the open-ended line stub SB1 used as the matching element directly connected to the transmission line 11L.

The switches SW1a, SW2a, SW1b and SW2b may be any switches such as diode switches, transistor switches, or MEMS (Micro Electro Mechanical Systems) switches. In order to turn on and off these switches, a switch control part 12S can be provided as indicated by the dashed box in FIG. 1, for example, so that the switch control part 12S provides to the switches SW1a, SW2a, SW1b and SW2b a control signal that electrically controls on and off of the switches according to a given frequency band selection signal. However, the switch control part 12S does not relate to the essence of the present invention and therefore is not described or depicted unless needed in the following description of embodiments.

The variable matching circuits 11a and 11b in FIG. 1 are capable of matching at four frequency bands by using two line stubs and two switches. Thus, a variable matching circuit can be configured with fewer elements than a conventional configuration.

Second Embodiment

In the example described above with reference to FIGS. 2 to 5, matching can be achieved at a frequency f4 when both of the switches SW1 and SW2 are on. However, frequency f4 is fixed and cannot freely adjusted because lengths L1, L2, L3, Ls1, and Ls2 have already been determined for matching at frequencies f1, f2, and f3. An embodiment that overcomes this drawback will be described below.

Figure 6:
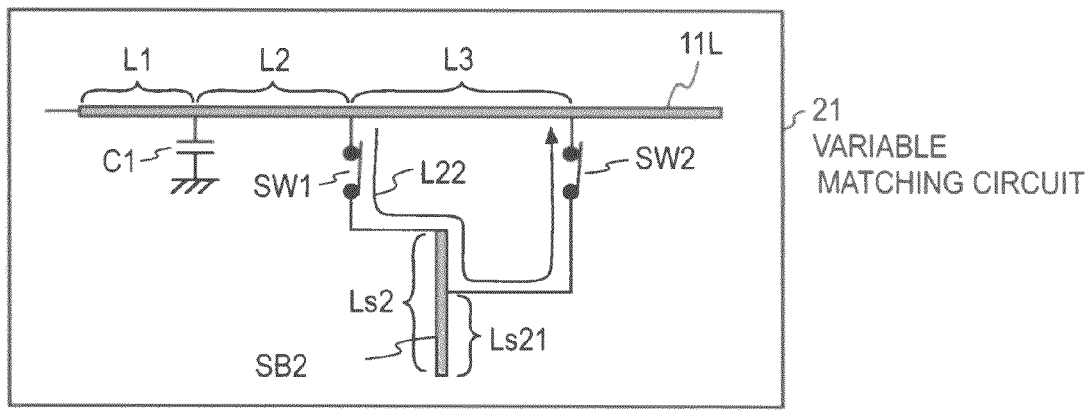
FIG. 6 is a diagram illustrating an exemplary configuration of a variable matching circuit.

The embodiment in FIG. 6 uses a capacitor C1 as a matching element instead of the line stub SB1 in FIG. 2. One end of the capacitor C1 is connected to a transmission line 11L and the other end is grounded. The other ends of the switches SW1 and SW2 in FIG. 2 are connected to the same end of the line stub SB2, while, in FIG. 6, one switch SW1 is connected to one end of a line stub SB2 and the other switch SW2 is connected to an arbitrary position on the line stub SB2 (a position at a distance Ls21 from the other end of the line stub SB2). The positions where the capacitor C1 and the switches SW1 and SW2 are connected to the transmission line 11L are spaced apart at distances L1, L2, and L3 in order from one end of the transmission line 11L.

When both of the switches SW1 and SW2 are off or one of the switches SW1 and SW2 is on, the variable matching circuit 21 operates in the same way as it does when only the capacitor C1 is connected to the transmission line 11L or the capacitor C1 and the line stub SB2 having a length Ls2 are connected to the transmission line 11L. On the other hand, when both of the switches SW1 and SW2 are on, the transmission line section L3 between the two switches SW1 and SW2 and a bypass path L22 that passes through the switch SW1, a portion of the line stub SB2 and the switch SW2 are connected in parallel with each other, so that a length Ls21 of stub is connected to the bypass line L22. Here, a desired length Ls21 can be chosen for adjustment of matching while both of the switches SW1 and SW2 are on because the switch SW2 can be connected to any position on the line stub SB2 when only one of the switches SW1 and SW2 is on.

That is, the length of section L1 of the transmission line 11L and the capacitance of the capacitor C1 can be determined so that matching is achieved at a frequency f1 when the switches SW1 and SW2 are off, the length of the section L2 and the length Ls2 of the line stub SB2 can be determined so that matching is achieved at a frequency f2 when the switch SW1 is on and switch SW2 is off, the length of section L3 can be determined so that matching is achieved at a frequency f3 when the switch SW1 is off and the switch SW2 is on, and the connection position Ls21 on the line stub SB2 can be determined so that matching is achieved at a frequency f4 when the switches SW1 and SW2 are on. With this configuration, four desired frequency bands can be selectively set with the two switches and the two matching elements.

Figure 7A:
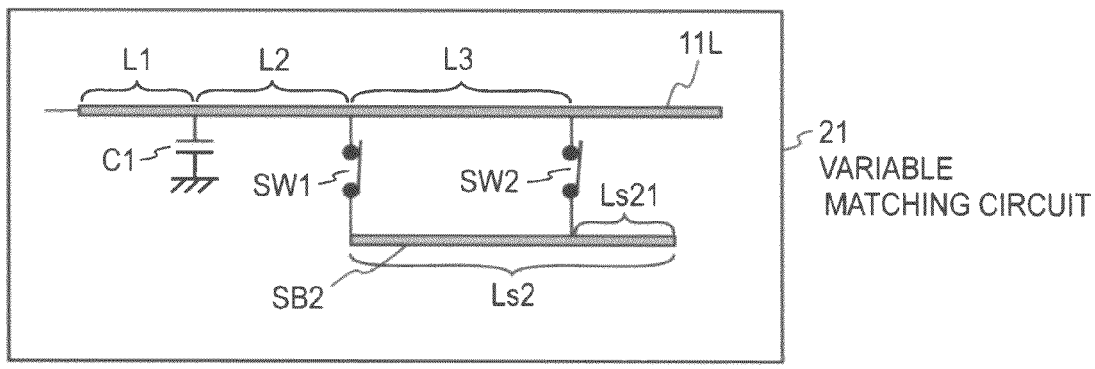
FIG. 7A is a diagram illustrating an exemplary configuration of a variable matching circuit 21.
Figure 7B:
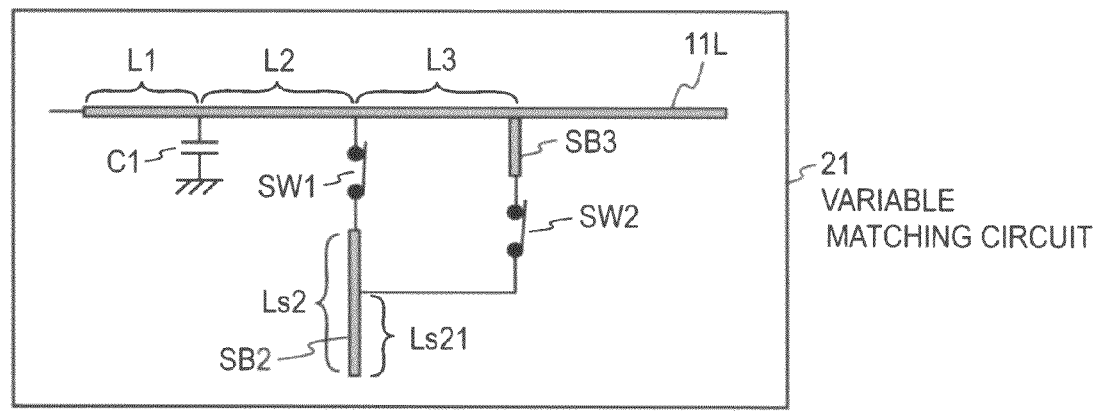
FIG. 7B is a diagram illustrating another exemplary configuration of the variable matching circuit 21.

FIGS. 7A and 7B illustrate modifications of the variable matching circuit 21 illustrated in FIG. 6. In FIG. 7A, a line stub SB2 is disposed in parallel to the transmission line 11L. In this example, the connection path between the transmission line 11L and the line stub SB2 through the switches SW1 and SW2 can be reduced. In the example in FIG. 7B, a short stub SB3 is provided between the transmission line 11L and the switch SW2. This further increases the flexibility of adjusting matching.

The transmission line 11L in FIG. 7B may be bent 90 degrees at an arbitrary position in the section L3 toward the line stub SB2 to connect the switch SW2 to any position on the line stub SB2 at the shortest connection distance. Furthermore, while the switch SW1 is connected to one end of the line stub SB2 and the switch SW2 is connected to an arbitrary position on the line stub SB2 in FIGS. 6, 7A and 7B, the switch SW1 may be connected to an arbitrary position on the line stub SB2 and the switch SW2 may be connected to one of the ends of the line stub SB2.

When the switch SW1 is off and the switch SW2 is on in FIG. 6, characteristics of the variable matching circuit 21 are substantially the same regardless of where on the line stub SB2 the switch SW2 is connected. This fact can be seen from FIGS. 8A, 8B, 9A and 9B described below.

Figure 8A:
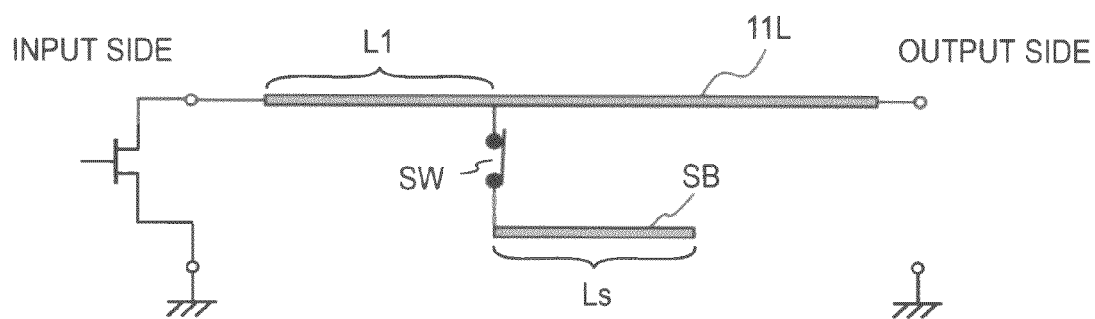
FIG. 8A is a diagram illustrating a switch connected to an end of a line stub.
Figure 8B:
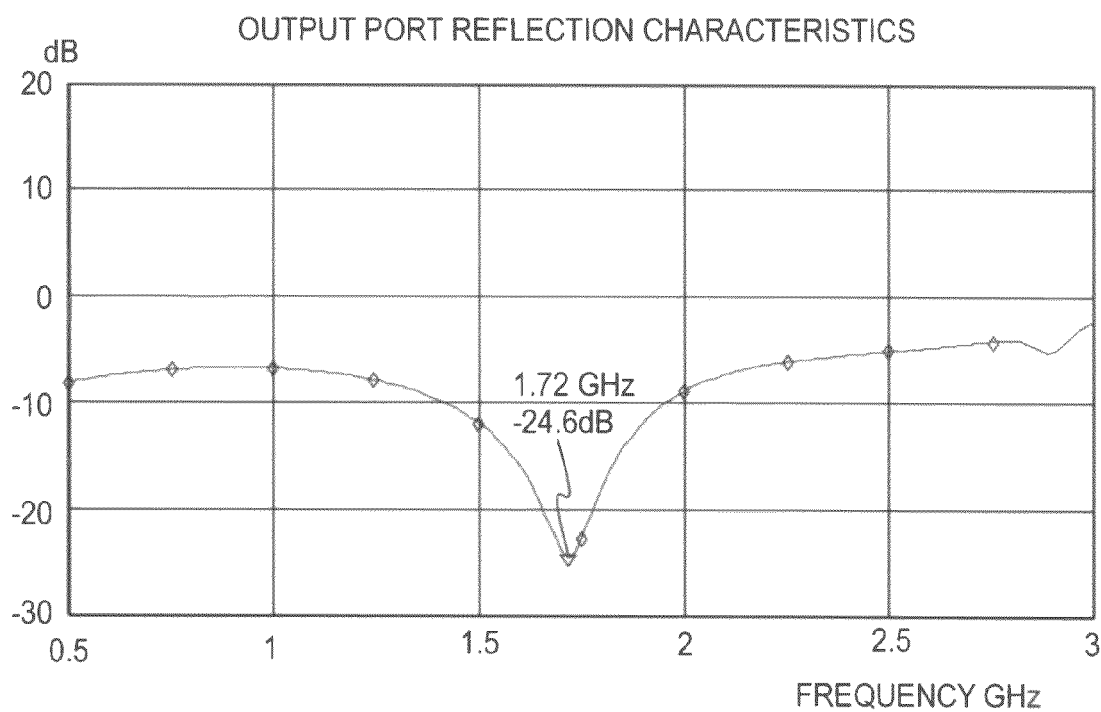
FIG. 8B is a graph showing characteristics of the configuration illustrated in FIG. 8A.
Figure 9A:
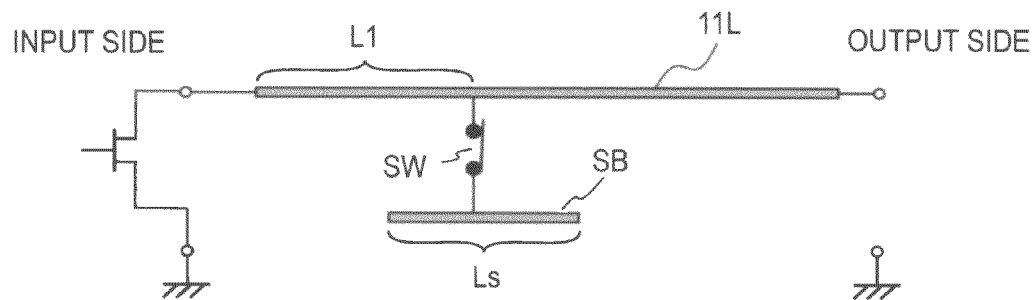
FIG. 9A is a diagram illustrating a switch connected to an intermediate point of a line stub.
Figure 9B:
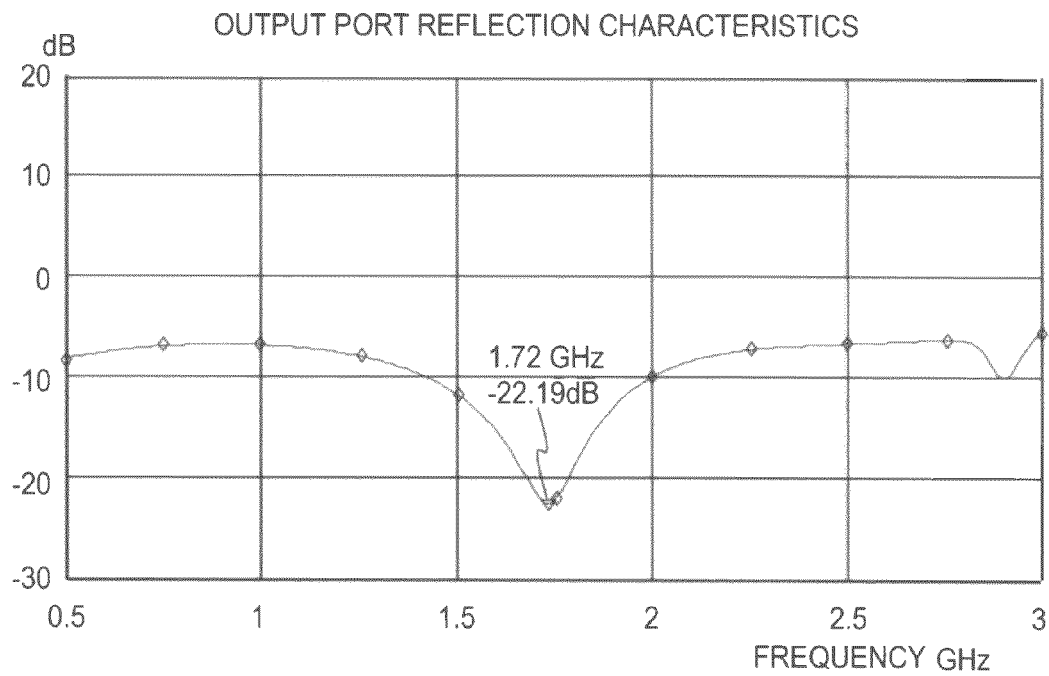
FIG. 9B is a graph showing characteristics of the configuration illustrated in FIG. 9A.

FIG. 8A illustrates a configuration in which one end of a line stub SB having a length Ls is connected through a switch SW to a position on a transmission line 11L at a distance L1 from the input end of the transmission line 11L. FIG. 8B illustrates the result of a simulation of output port reflection characteristics of the configuration, specifically an output port reflection coefficient |S (2, 2)|. This example shows that matching at 1.72 GHz can be achieved. In FIG. 9A, a line stub SB having a length Ls is connected through a switch SW to a position on a transmission line 11L at a distance L1 from the input end of the transmission line 11L as in the case of FIG. 8A but the line stub SB is connected at an intermediate point between both ends in the lengthwise direction thereof. As shown in FIG. 9B, the result of a simulation of output port reflection characteristics in this example is almost the same as the result in FIG. 8B and matching at 1.72 GHz can be achieved. This shows that substantially the same characteristics can be obtained regardless of where on the line stub the transmission line is connected. The configuration in FIG. 6 takes advantage of this result.

In the variable matching circuit 21 in FIG. 6, a line stub that has an open end may be provided instead of the capacitor C1, as in FIG. 2 or a line stub having a short-circuited end or an inductor may be provided. While the other end of the switch SW1 is connected to one end of the line stub SB2 in FIG. 6, the other end of the switch SW1 may be connected to any position on the line stub SB2 as apparent from the description above.

[Variation 1]

Figure 10:
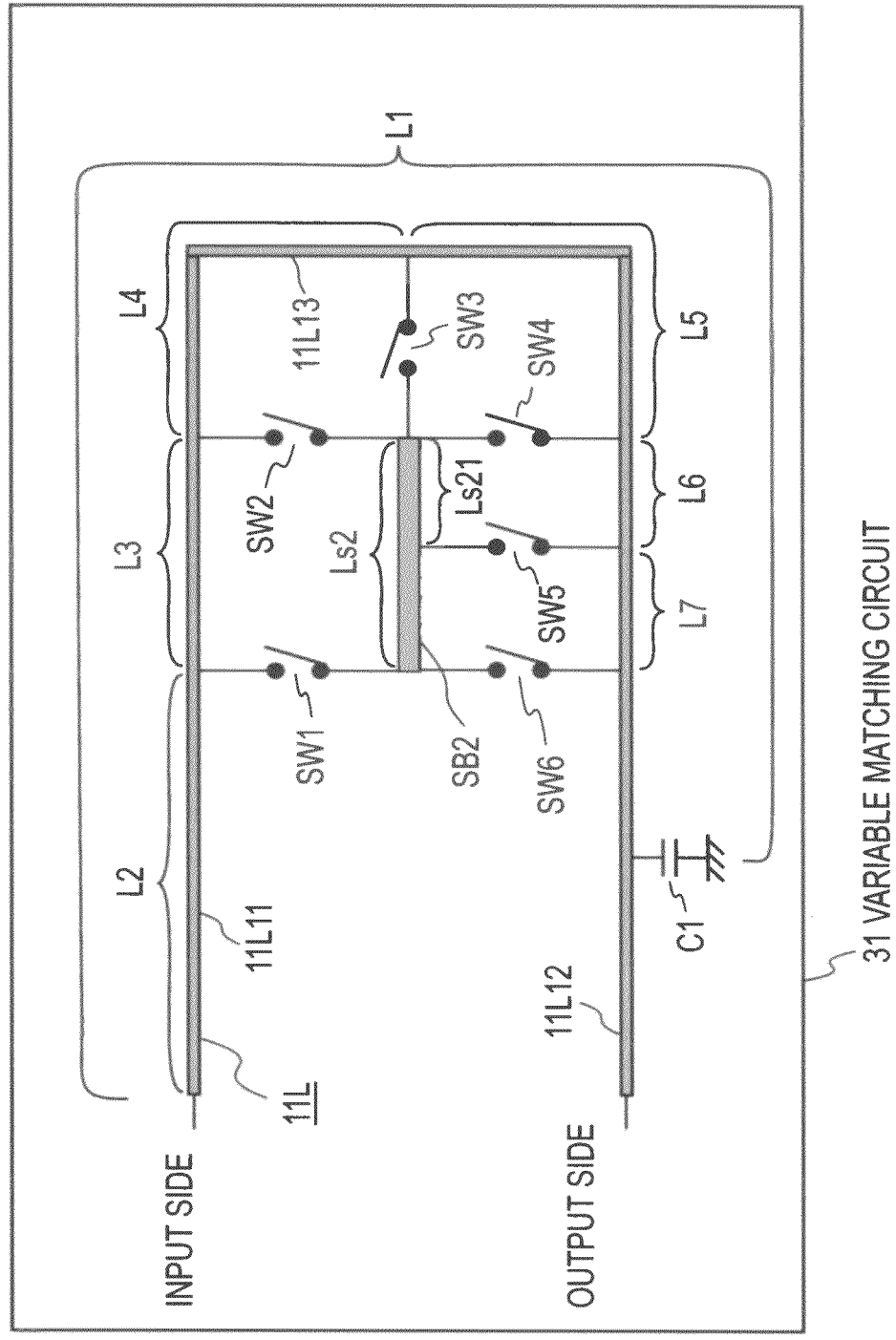
FIG. 10 is a diagram illustrating an exemplary functional configuration of a variable matching circuit 31.

Referring to FIG. 10, a variation of the second embodiment will be described, which is a variable matching circuit 31 including six switches (SW1 to SW6) and one line stub. In this example, a transmission line 11L is bent into U shape in such a manner that the input side and the output side of the transmission line 11L are parallel to each other, so that the transmission line 11L is made up of an input-side line section 11L11, an output-side line section 11L12, and an intermediate line section 11L13 connecting between respective one ends of the line sections 11L11 and 11L12. A line stub SB2 is provided between and in parallel with the input-side line section 11L11 and the output-side line section 11L12. In the example in FIG. 10, a capacitor C1 is connected between the transmission line 11L and a ground at a position on the output-side line section 11L12 a distance L1 away from the input end of the input-side line section 11L11. Both ends of the line stub SB2 are connected to the input-side line section 11L11 through switches SW1 and SW2 and also connected to the output-side line section 11L12 through switches SW6 and SW4. The end of the line stub SB2 that is close to the intermediate line section 11L13 is connected to the intermediate line section 11L13 through a switch SW3 and an intermediate point of the line stub SB2 is connected to the output-side line section 11L12 through a switch SW5. The switches SW1 to SW6 are connected to the transmission line 11L at spacings of L2, L3, L4, L5, L6 and L7 in order from the input end of the transmission line 11L.

Figure 11A:
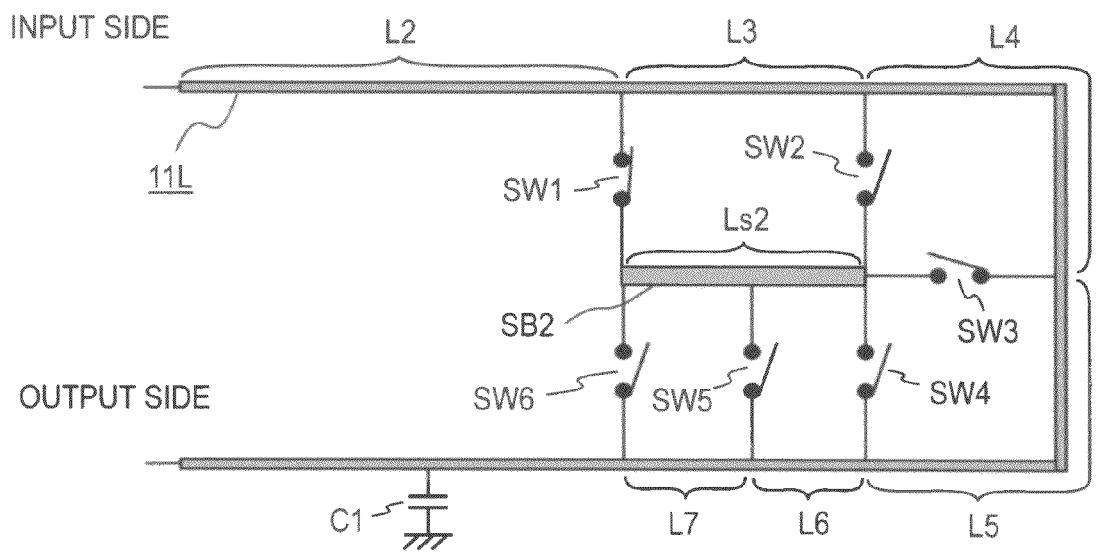
FIG. 11A is a diagram illustrating an example of the states of the switches of the variable matching circuit 31.
Figure 11B:
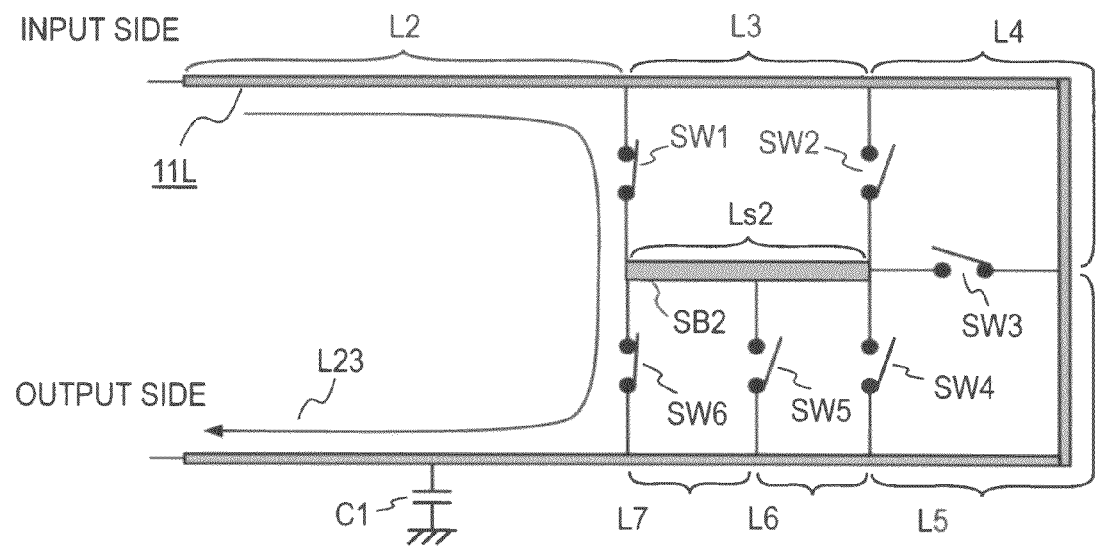
FIG. 11B is a diagram illustrating another example of the states of the switches.

When all of the switches SW1 to SW6 are off, matching can be achieved at a frequency f1 that is determined by the length of the transmission line section L1 from the input end of the input-side line section 11L11 to the position where the capacitor C1 is connected and the capacitor C. When one of the switches SW1 to SW6 is turned on as illustrated in FIG. 11A, matching can be achieved at a frequency 12 that is determined by the length of the transmission line section from the input end of the input-side line section 11L11 to the position where the switch turned on is connected and the length Ls2 of the line stub SB2. Thus, matching at six frequencies can be achieved by selecting one of the switches SW1 to SW6 to turn on. Furthermore, two of the switches SW1 to SW6 that are connected to the same one end of the line stub SB2, for example SW1 and SW6, in FIG. 10 are turned on as illustrated in FIG. 11B, a bypass circuit L23 that bypasses the line sections L3 to L7 of the transmission line 11L is formed and the line stub SB2 with a length Ls2 connected to the bypass circuit L23 functions as a matching element.

When two of the switches SW1 to SW6 in FIG. 10, one connected to one end of the line stub SB2 and the other connected to the other end, are turned on, the line stub SB2 functions as a bypass circuit. When two switches, for example switches SW1 and SW5 in FIG. 10, connected to one end and an intermediate position of the line stub SB2, are turned on, a bypass circuit that passes through the switch SW1, a portion of the line stub SB2 and the switch SW5 is formed and a portion having a length Ls21 from the other end of the line stub SB2 functions as a matching element connected to the bypass circuit. Various other combinations of the switches are possible and the number of frequencies at which matching can be achieved increases with the number of combinations.

Third Embodiment

FIG. 12 illustrates a multiband power amplifying apparatus in which variable matching circuits each having two switches and two matching elements are provided, one on the input side of a power amplifier AMP and the other on the output side of the power amplifier AMP. FIGS. 13 to 16 show examples of characteristics of the variable matching circuits 31a and 31b at different states of the switches. In FIG. 12, the variable matching circuit 31b on the output side has a configuration in which an open-ended line stub SB1b is connected in place of the capacitor C1 in FIG. 6 and the variable matching circuit 31a on the input side has a configuration symmetrical to the variable matching circuit 31b on the output side.

Figure 13:
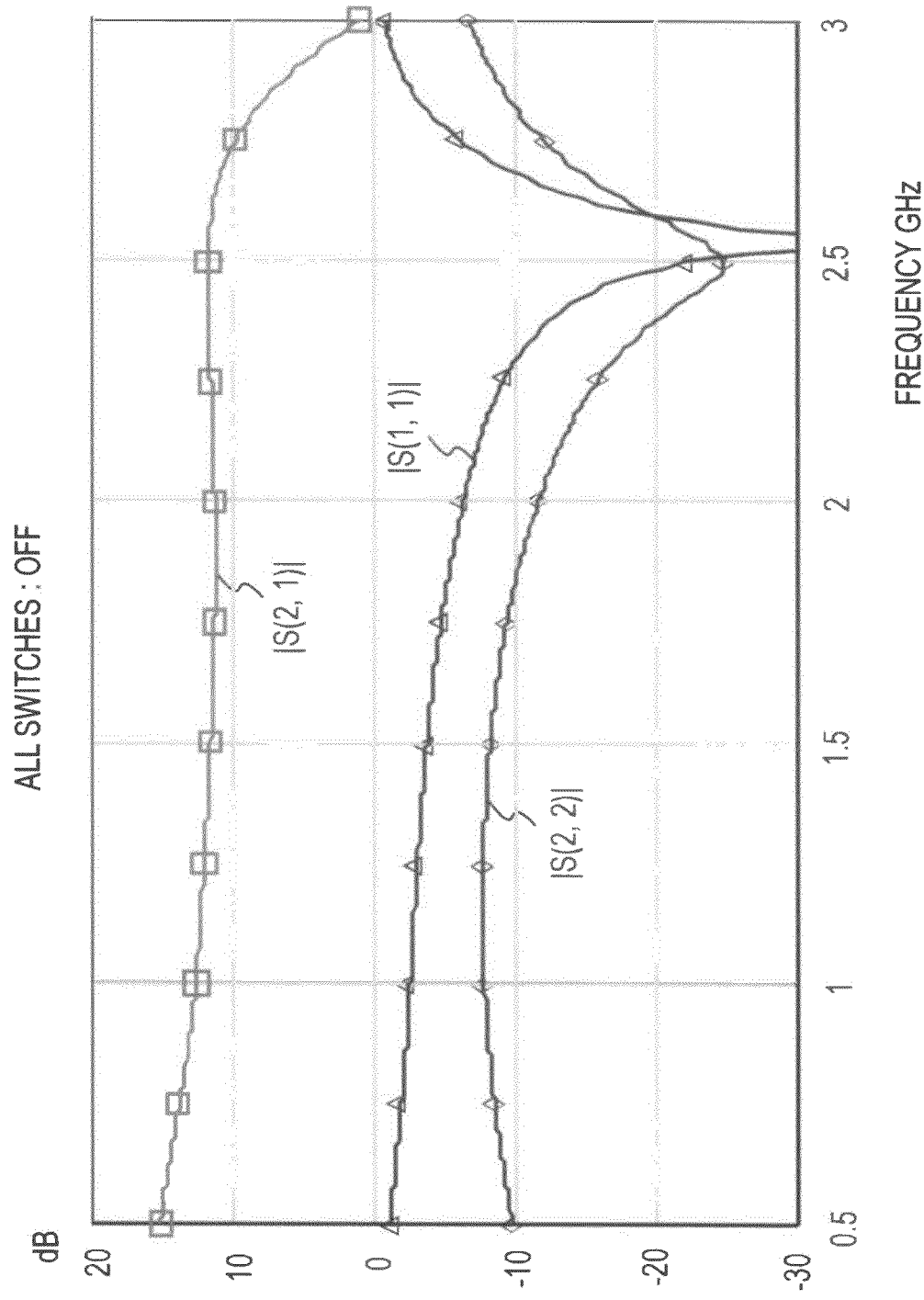
FIG. 13 is a graph showing characteristics of the third embodiment when all of the switches are off.
Figure 14:
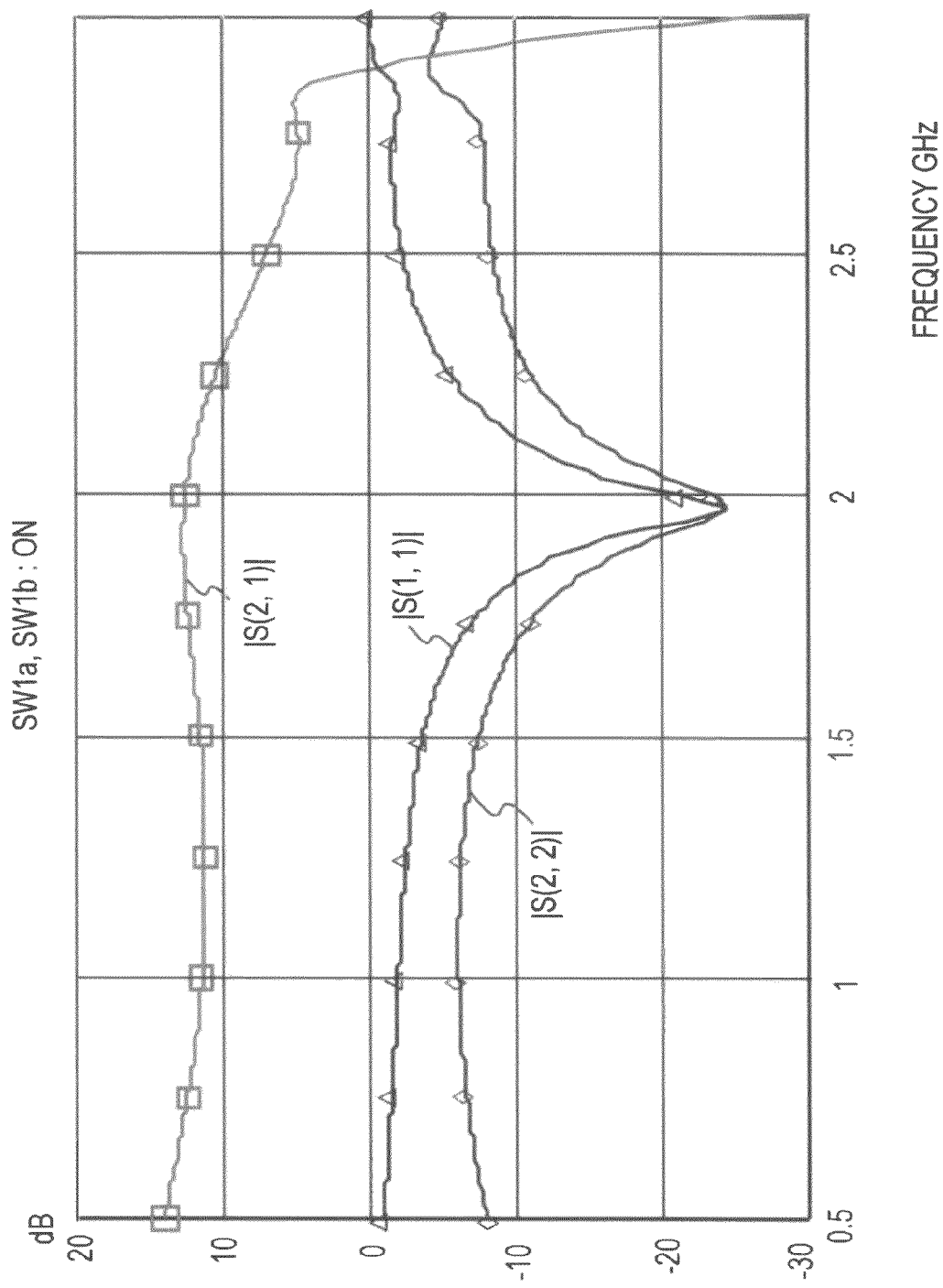
Figure 15:
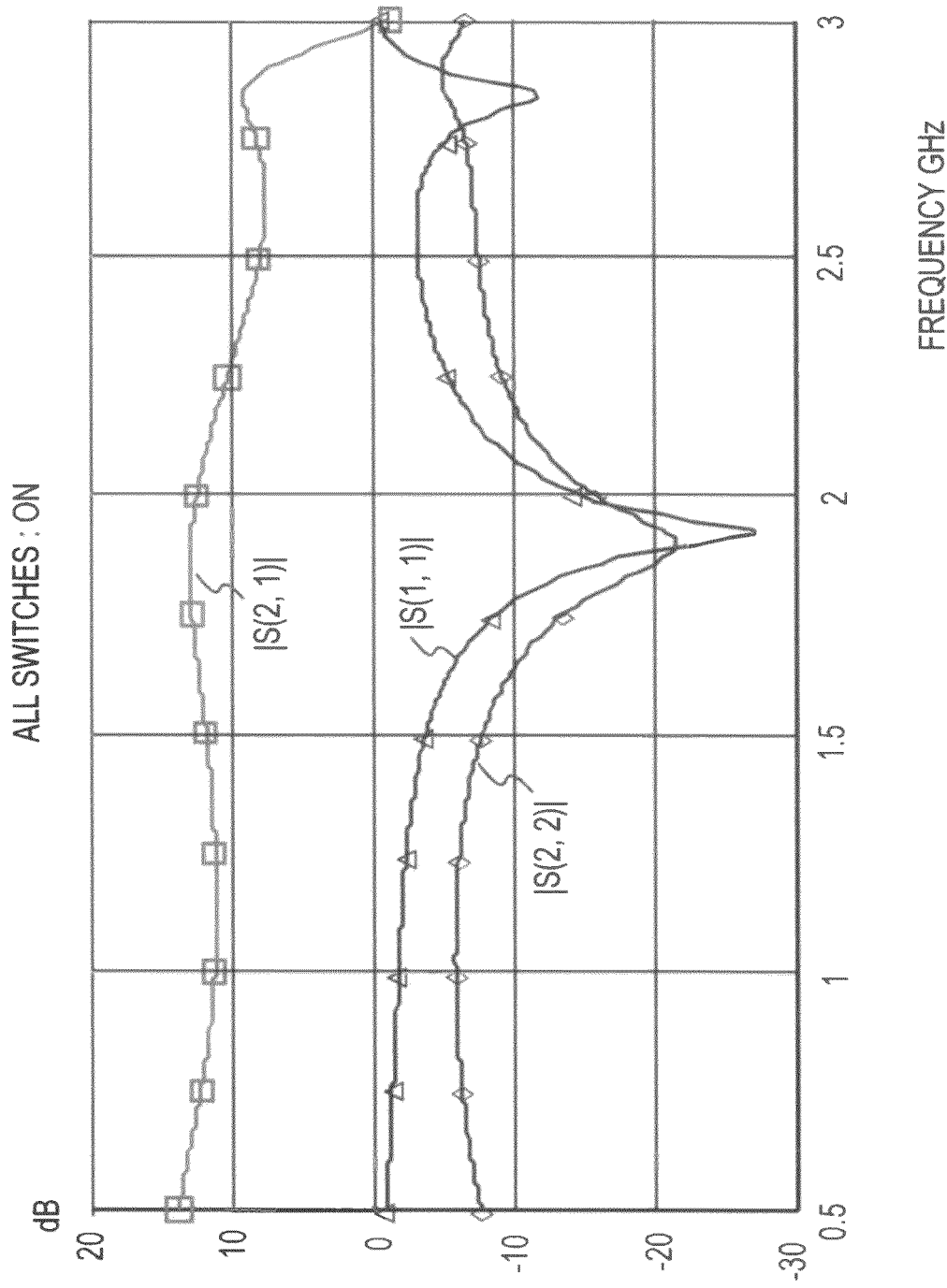
Figure 16:
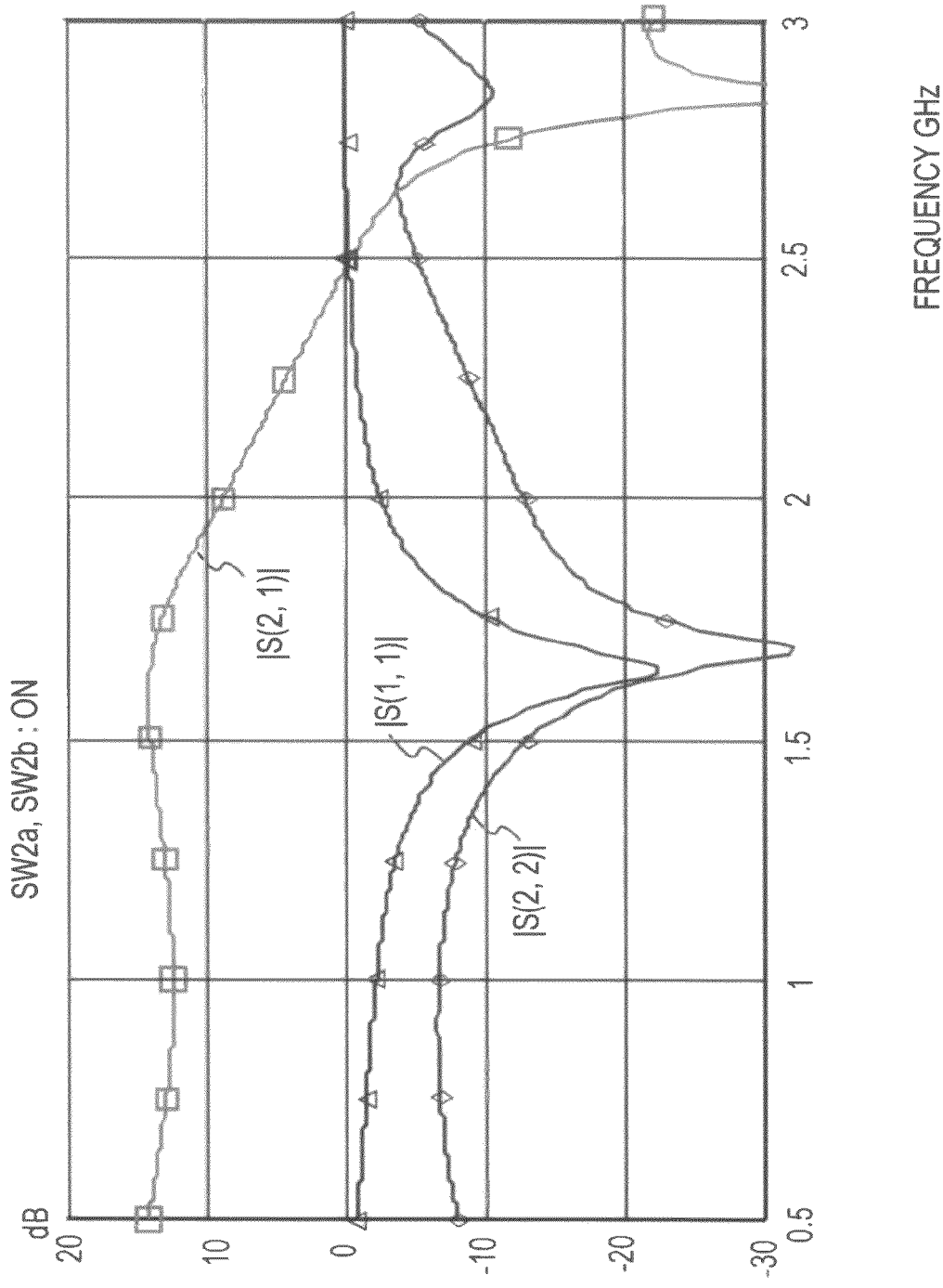

FIG. 13 illustrates S-parameter characteristics when all of the switches (SW1a, SW1b, SW2a and SW2b) are off. It can be seen from FIG. 13 that the input port reflection coefficient |S(1, 1)| and the output port reflection coefficient |S(2, 2)| are both matched at 2.5 GHz. The transmission coefficient |S(2, 1)| is also shown in FIG. 13. FIG. 14 shows S-parameter characteristics when switches SW1a and SW1b are on and switches SW2a and SW2b are off. It can be seen that matching is achieved at 1.9 GHz. FIG. 15 shows S-parameter characteristics when all of the switches SW1a, SW1b, SW2a and SW2b are on. It can be seen that matching is achieved at 1.8 GHz. FIG. 16 shows S-parameter characteristics when switches SW2a and SW2b are on and switches SW and SW1b are off. It can be seen that matching is achieved at 1.7 GHz.

In the embodiment in FIG. 1, when three of the four frequency bands at which matching can be achieved are once determined by choice, the remaining one frequency band is automatically determined and therefore flexible adjustment cannot be made. In contrast, in the configuration in FIG. 12 that uses the variable matching circuit in which the transmission line 11L can be connected to any intermediate position on the line stub SB2 through the switch SW2, all of the four frequency bands at which matching can be achieved are adjustable.

Fourth Embodiment

Figure 17:
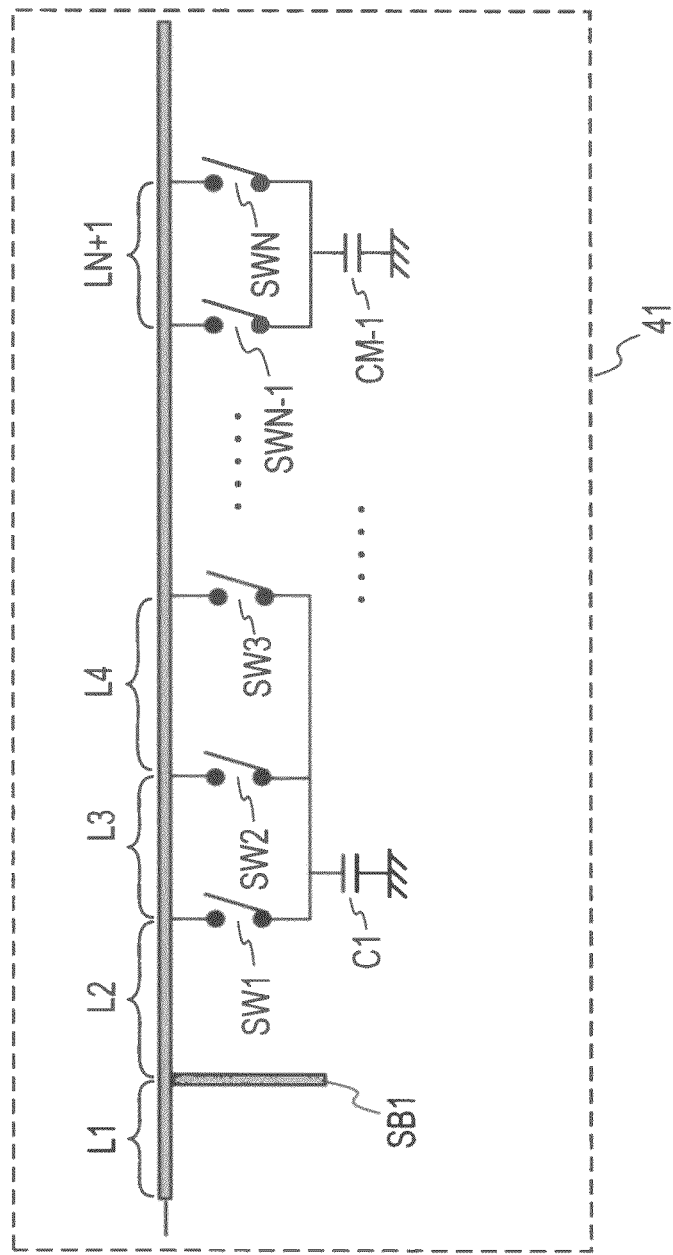
FIG. 17 is a diagram illustrating a configuration of a fourth embodiment.
Figure 19:
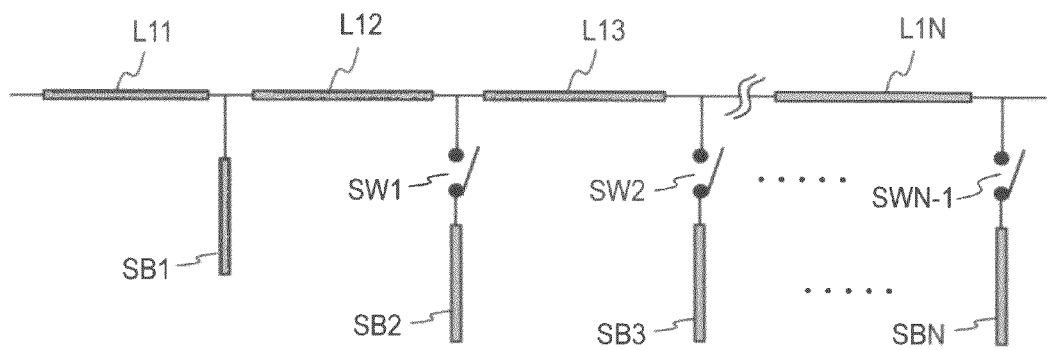
FIG. 19 is a diagram illustrating a configuration of a conventional variable matching circuit.

FIG. 17 illustrates an example of a variable matching circuit 41 using N switches and M matching elements, where N≥M≥2. One end of a line stub SB1, which is one of the matching elements, and one end of each of switches SW1 to SWN are connected to a transmission line 11L at spacings L1, . . . , LN+1 in order from the input end of the transmission line 11L. The other end of every switch SW1 to SWN is connected to one end of any one of M−1 capacitors C1 to CM−1, which are matching elements, and the other ends of all of the capacitors are grounded. Accordingly, at least two of the N switches are connected to the same end of at least one capacitor. In this respect, the fourth embodiment is based on the same inventive principle as the embodiment in FIG. 4, for example. For example, three switches SW1, SW2 and SW3 are connected to one capacitor C1 in FIG. 17. That is, on the whole, the number of the capacitors can be reduced below the number of the switches. Thus, the number of elements required for forming a variable matching circuit that support the same number of frequency bands can be reduced compared with the conventional technique illustrated in FIG. 19.

Figure 18:
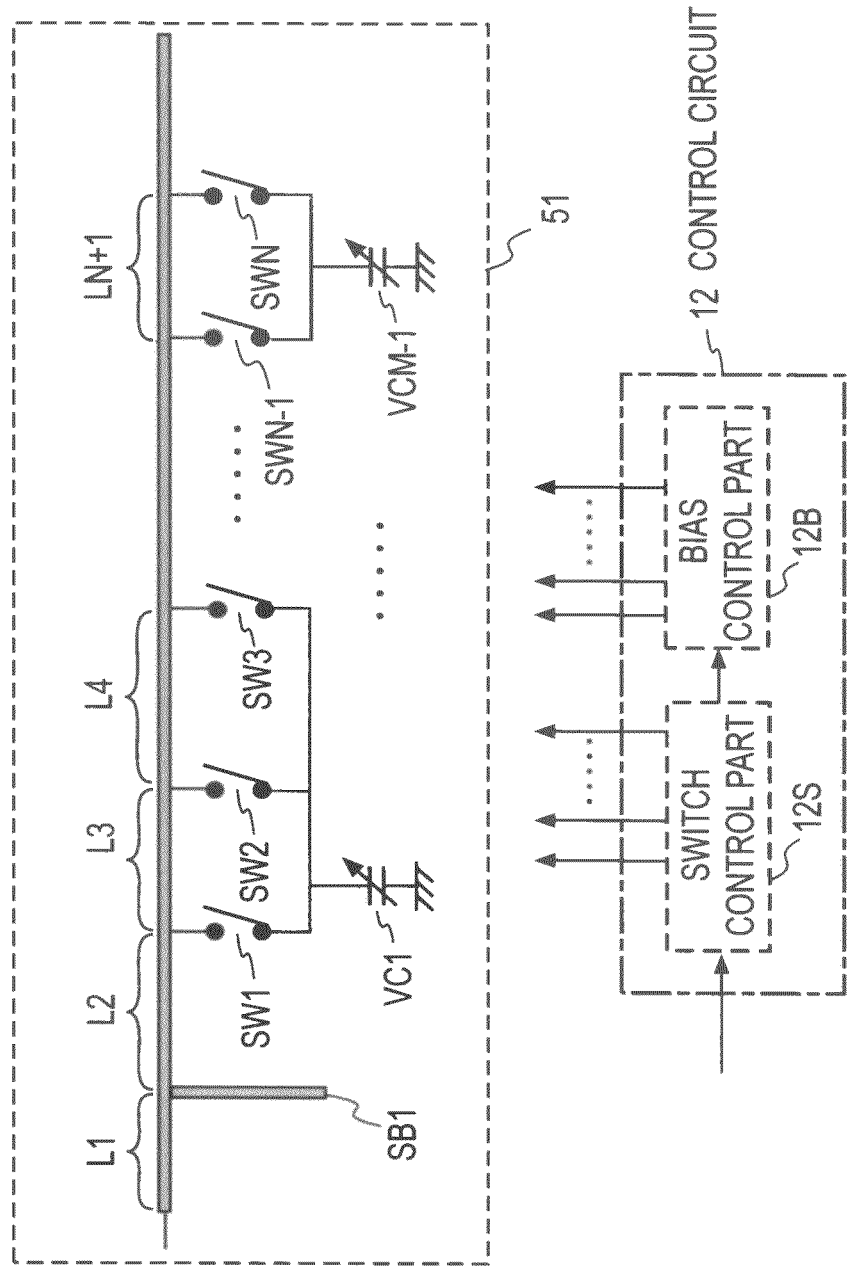
FIG. 18 is a diagram illustrating a configuration of a fifth embodiment.

Instead of the capacitors C1 to CM−1 in FIG. 17, line stubs having an open end or a short-circuit end, or inductors may be used as matching elements. If line stubs having an open end are used, one end of each of a plurality of switches may be connected to the transmission line 11L and the other end may be connected to any position on the same line stub as illustrated in FIGS. 6, 7A and 7B Fifth Embodiment FIG. 18 illustrates a variable matching circuit 51 using varactors VC1 to VCM−1 as matching elements instead of capacitors C1 to CM−1 in the variable matching circuit 41 in FIG. 17. Since the use of the varactors makes the capacitance variable, adjustment for each frequency band is further facilitated. When line stubs or lumped-constant reactance elements are used for adjustment, the lengths of line sections L2, L3 and L4, for example, are adjusted and, in addition, the capacitance of VC1 can be changed by changing the bias when switches are turned on. Thus, the flexibility of adjustment can be increased.

A bias value corresponding to each switch selected for each of the varactors VC1 to VCM−1 needs to be stored. For this purpose, a control circuit 12 including a switch control part 12S and a bias control part 12B may be provided as indicated by the alternate long and short dashed box in FIG. 18. Operation of the switch control part 12S is as described with reference to FIG. 1. During adjustment of matching at each frequency band, a bias voltage applied to a varactor associated with a switch that has been turned on is adjusted by the bias control part 12B and the determined bias voltage value is stored beforehand in storage means, not shown, in the bias control part 12B in association with the switch that has been turned on. In operation of the variable matching circuit, the bias control part 12B reads from the storage means the bias voltage value to be applied to the varactor associated with the switch to be turned on for a frequency band selected by the switch control part 12S and applies it as an analog bias voltage to the varactor.

The present invention is not limited to the embodiments described above. For example, while stubs and capacitors that are lines are used for matching at different frequencies in the embodiments described above, lumped-constant reactance elements may be used. In this case, reactance elements are connected to the switches in place of the line stabs in the embodiments described above. Other modifications can be made as appropriate without departing from the spirit of the present invention. Furthermore, while examples are given in which two switches and two matching elements are used according to the embodiments described above, more switches can be used with configurations similar to those of the embodiments to reduce the number of matching elements or to support more frequency bands.

INDUSTRIAL APPLICABILITY

Examples of applications of the present invention include communication apparatuses used in a broadband environment, for example RF circuit devices used in mobile phone terminals used in a multiband environment.

What is claimed is:

1. A variable matching circuit comprising a transmission line, first and second switches and first and second matching elements, wherein
first ends of the first matching element and the first and second switches are directly connected to the transmission line at arbitrary distance intervals, second ends of the first and second switches are connected to the second matching element, the first and second matching elements each have an open end or a short-circuited end, allowing selection of a frequency band by combining on and off of the first and second switches.

2. The variable matching circuit according to claim 1, wherein the second matching element is formed by a line stub having the open end, and the second ends of the first and second switches are connected to arbitrary positions on the line stub.

3. The variable matching circuit according to claim 1, wherein the second matching element is formed by a line stub having the open end, the second end of the first switch is connected to one end of the line stub, the second end of the second switch is connected to an arbitrary position on the line stub, and a length of the line stub when both of the first and second switches are on is adjustable.

4. A variable matching circuit comprising a transmission line, first to Nth switches, and first to Mth matching elements, where N is an integer greater than or equal to 2 and M is an integer greater than or equal to 2 and less than or equal to N, wherein
first ends of the first matching element and the first to Nth switches are directly connected to the transmission line at desired distance intervals, second ends of the first to Nth switches are all connected respectively to any one of a second to Mth matching elements, second ends of the first to Mth matching elements are opened or short-circuited, and at least two of the first to Nth switches are connected to a first end of at least one of the second to Mth matching elements.

5. The variable matching circuit according to claim 4, wherein M equals 2, the second matching element is formed by a line stub having an open end, the second ends of all of the N switches are connected to arbitrary positions on the line stub and, when at least two of the N switches are turned on, a bypass circuit of the transmission line passing through a section between the at least two of the N switches that have been turned on is formed.

6. The variable matching circuit according to claim 4, wherein the second to Mth matching elements are formed by varactors, the second ends of the varactors are short-circuited, and capacitances of the varactors are adjustable by application of a bias to the varactors.

7. A variable matching circuit comprising a transmission line, first and second switches and first and second matching elements, wherein
first ends of the first matching element and the first and second switches are connected to the transmission line at arbitrary distance intervals, the first matching element has an open end or a short-circuited end, the second matching element is formed by a line stub having an open end, second ends of the first and second switches are connected to arbitrary positions on the line stub, allowing selection of a frequency band by combining on and off of the first and second switches.

8. A variable matching circuit comprising a transmission line, first to Nth switches, and first to Mth matching elements, where N is an integer greater than or equal to 2 and M is an integer greater than or equal to 2 and less than or equal to N, wherein
first ends of the first matching element and the first to Nth switches are connected to the transmission line at desired distance intervals, second ends of the first to Nth switches are all connected respectively to any one of a second to Mth matching elements, a second end of the first matching element is opened or short-circuited, each of the second to Mth matching elements is formed by a line stub having an open end, each of the second ends of the first to Nth switches is connected to an arbitrary position on a corresponding line stub, and at least two of the first to Nth switches are connected to a first end of at least one of the second to Mth matching elements.

* * * * *